(12) United States Patent
Suyama et al.

(10) Patent No.: US 10,381,393 B2
(45) Date of Patent: Aug. 13, 2019

(54) IMAGE PICKUP APPARATUS AND METHOD FOR MANUFACTURING IMAGE PICKUP APPARATUS

(71) Applicant: OLYMPUS CORPORATION, Tokyo (JP)

(72) Inventors: Takuro Suyama, Ina (JP); Takahiro Shimohata, Shiojiri (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 15/241,741

(22) Filed: Aug. 19, 2016

(65) Prior Publication Data

US 2016/0358965 A1 Dec. 8, 2016

Related U.S. Application Data

(63) Continuation of application No. PCT/JP2015/054291, filed on Feb. 17, 2015.

(30) Foreign Application Priority Data

Feb. 24, 2014 (JP) .................................. 2014-033080
Feb. 24, 2014 (JP) .................................. 2014-033083

(51) Int. Cl.
*H01L 27/146* (2006.01)
*H01L 31/0203* (2014.01)
(Continued)

(52) U.S. Cl.
CPC .. *H01L 27/14632* (2013.01); *H01L 27/14618* (2013.01); *H01L 27/14636* (2013.01);
(Continued)

(58) Field of Classification Search
CPC ......... H01L 27/14632; H01L 27/14618; H01L 27/14636; H01L 27/14687;
(Continued)

(56) References Cited

U.S. PATENT DOCUMENTS 6,142,930 A * 11/2000 Ito ...................... A61B 1/00096
348/76
6,319,745 B1 * 11/2001 Bertin ............... H01L 27/14618
438/113
(Continued)

FOREIGN PATENT DOCUMENTS

JP H05-115435 A 5/1993
JP H05-88546 B2 12/1993
(Continued)

OTHER PUBLICATIONS

International Search Report dated May 12, 2015 issued in corresponding International Patent Application No. PCT/JP2015/054291.
(Continued)

*Primary Examiner* — Tong-Ho Kim
(74) *Attorney, Agent, or Firm* — Scully, Scott, Murphy & Presser, P.C.

(57) ABSTRACT

An image pickup apparatus is an image pickup apparatus including: an image pickup device including a plurality of electrode pads provided in a row on an outer peripheral portion of a light-receiving surface on which a light-receiving section is formed, the plurality of electrode pads being connected to the light-receiving section; and a wiring board including a plurality of inner leads connected to respective electrode pads, wherein each of the inner leads includes a distal end portion, a bent portion and a rear end portion, the distal end portion is connected to the corresponding electrode pad, the bent portion includes a first bent portion having a recess shape relative to the light-receiving surface and a second bent portion having a protruding shape relative to the light-receiving surface, and the rear end portion is disposed in parallel with a side face of the image pickup device.

17 Claims, 15 Drawing Sheets

(51) Int. Cl.
*H01L 31/02* (2006.01)
*H04N 5/335* (2011.01)
*H05K 1/02* (2006.01)
*H04N 5/225* (2006.01)
*H05K 3/00* (2006.01)
*H05K 3/36* (2006.01)

(52) U.S. Cl.
CPC .... *H01L 27/14687* (2013.01); *H01L 31/0203* (2013.01); *H01L 31/02005* (2013.01); *H04N 5/2253* (2013.01); *H04N 5/335* (2013.01); *H05K 1/028* (2013.01); *H01L 2924/0002* (2013.01); *H05K 3/0052* (2013.01); *H05K 3/363* (2013.01); *H05K 2201/0187* (2013.01); *H05K 2201/0382* (2013.01); *H05K 2201/0397* (2013.01); *H05K 2201/0909* (2013.01); *H05K 2201/09472* (2013.01); *H05K 2201/09909* (2013.01)

(58) Field of Classification Search
CPC ........... H01L 31/02005; H01L 31/0203; H01L 2924/0002; H04N 5/2253; H04N 5/335; H05K 1/028; H05K 3/0052; H05K 3/363; H05K 2201/0187; H05K 2201/0382; H05K 2201/0397; H05K 2201/0909; H05K 2201/09472; H05K 2201/09909
USPC ......................................................... 257/433
See application file for complete search history.

(56) References Cited

U.S. PATENT DOCUMENTS

| | | | | |
|---|---|---|---|---|
| 2002/0038851 | A1* | 4/2002 | Kajiwara | A61B 6/4216 250/368 |
| 2011/0193940 | A1* | 8/2011 | Park | H01L 27/14687 348/46 |
| 2015/0014805 | A1* | 1/2015 | Yamada | H04N 5/2254 257/443 |
| 2015/0085169 | A1* | 3/2015 | Igarashi | H01L 25/042 348/294 |

FOREIGN PATENT DOCUMENTS

| | | |
|---|---|---|
| JP | H07-297226 A | 11/1995 |
| JP | H08-148666 A | 6/1996 |
| JP | H09-069618 A | 3/1997 |
| JP | 10-192235 A | 7/1998 |
| JP | 2001-345438 A | 12/2001 |
| JP | 2005-329093 A | 12/2005 |
| WO | 2013/179765 A1 | 12/2013 |

OTHER PUBLICATIONS

English Abstract of JPS63289944A, dated Nov. 28, 1988.

* cited by examiner

IMAGE PICKUP APPARATUS AND METHOD FOR MANUFACTURING IMAGE PICKUP APPARATUS

CROSS REFERENCE TO RELATED APPLICATIONS

This application is a continuation application of PCT/JP2015/054291 filed on Feb. 17, 2015 and claims benefit of Japanese Applications No. 2014-033080 filed in Japan on Feb. 24, 2014, and No. 2014-033083 filed in Japan on Feb. 24, 2014, the entire contents of each of which are incorporated herein by their reference.

BACKGROUND OF INVENTION

1. Field of the Invention

The present invention relates to an image pickup apparatus including an image pickup device that includes a plurality of electrode pads provided in a row on an outer peripheral portion of a light-receiving surface on which a light-receiving section is formed, the plurality of electrode pads being connected to the light-receiving section, and a flexible wiring board including a plurality of inner leads each connected to any of the plurality of electrode pads, and a method for manufacturing the image pickup apparatus.

2. Description of the Related Art

Japanese Patent Application Laid-Open Publication No. 5-115435 discloses a solid-state image pickup apparatus 101, which is illustrated in FIG. 1. The solid-state image pickup apparatus 101 includes a solid-state image pickup device 110 in which a light-receiving section is formed, and a substrate 120. Inner leads 121 of the substrate 120 are connected to metal protrusions 114, which are bumps for external connection of the solid-state image pickup device 110.

The solid-state image pickup device 110 has a small diameter because the inner leads 121 are bent substantially to a right angle toward the side opposite to a light-receiving surface 110SA. In addition, in order to prevent the inner leads 121 from coming into contact with the solid-state image pickup device 110 and thereby causing a short circuit, insulating plates 150 are disposed on respective side faces of the solid-state image pickup device 110.

However, it is not easy to dispose the insulating plates 150 on the respective side faces of a quite-small solid-state image pickup device 110 to be disposed in, for example, a distal end portion of an endoscope.

SUMMARY OF THE INVENTION

An image pickup apparatus according to an embodiment of the present invention is an image pickup apparatus including an image pickup device including a plurality of electrode pads provided in a row on an outer peripheral portion of a light-receiving surface on which a light-receiving section is formed, the plurality of electrode pads being connected to the light-receiving section; and a flexible wiring board including a plurality of inner leads each connected to any one electrode pad of the plurality of electrode pads, wherein each of the plurality of inner leads includes a distal end portion, a bent portion and a rear end portion, the distal end portion is connected to the corresponding electrode pad, the bent portion includes a first bent portion having a recessed shape relative to the light-receiving surface and a second bent portion having a protruding shape relative to the light-receiving surface, and the rear end portion is disposed in parallel with a side face of the image pickup device.

Also, an image pickup apparatus manufacturing method according to another embodiment includes: a wafer step of fabricating a semiconductor wafer including, on a light-receiving surface, a plurality of light-receiving sections and a plurality of electrode pads provided in a row on a periphery of each light-receiving section, the plurality of electrode pads being connected to the light-receiving section; a cutting step of cutting the semiconductor wafer into individual image pickup devices each including the plurality of electrode pads provided in a row on an outer peripheral portion of the light-receiving section; a bonding step of connecting distal end portions of a plurality of inner leads protruding from an end face of a flexible wiring board to respective electrode pads of the plurality of electrode pads of the image pickup device; a first bending step of plastically deforming the plurality of inner leads so as to be inclined relative to the light-receiving surface, with respective portions of the plurality of inner leads, the portions being connected respectively to the plurality of electrode pads, as respective starting points; and a second bending step of bending and plastically deforming the plurality of inner leads so that rear end portions of the plurality of inner leads are parallel with a side face of the image pickup device.

DETAILED DESCRIPTION OF THE PREFERRED EMBODIMENTS

First Embodiment

Figure 1:
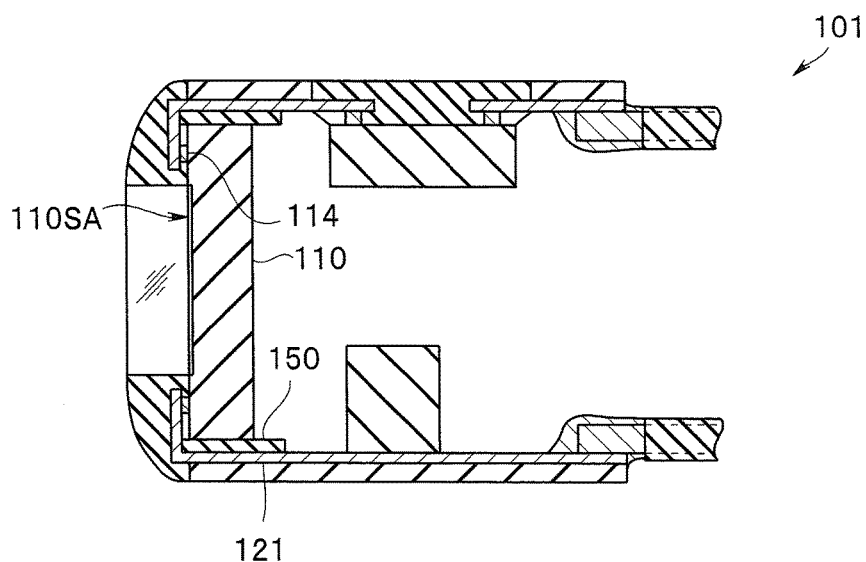
FIG. 1 is a cross-sectional view of a conventional image pickup apparatus.
Figure 2:
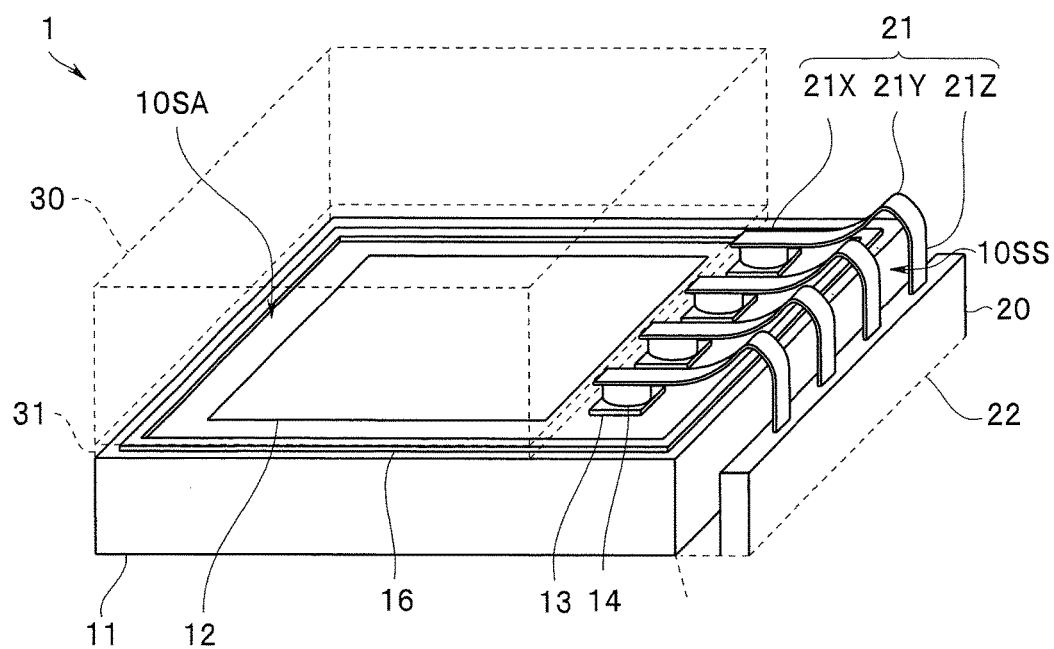
FIG. 2 is a perspective view of an image pickup apparatus according to a first embodiment.
Figure 3:
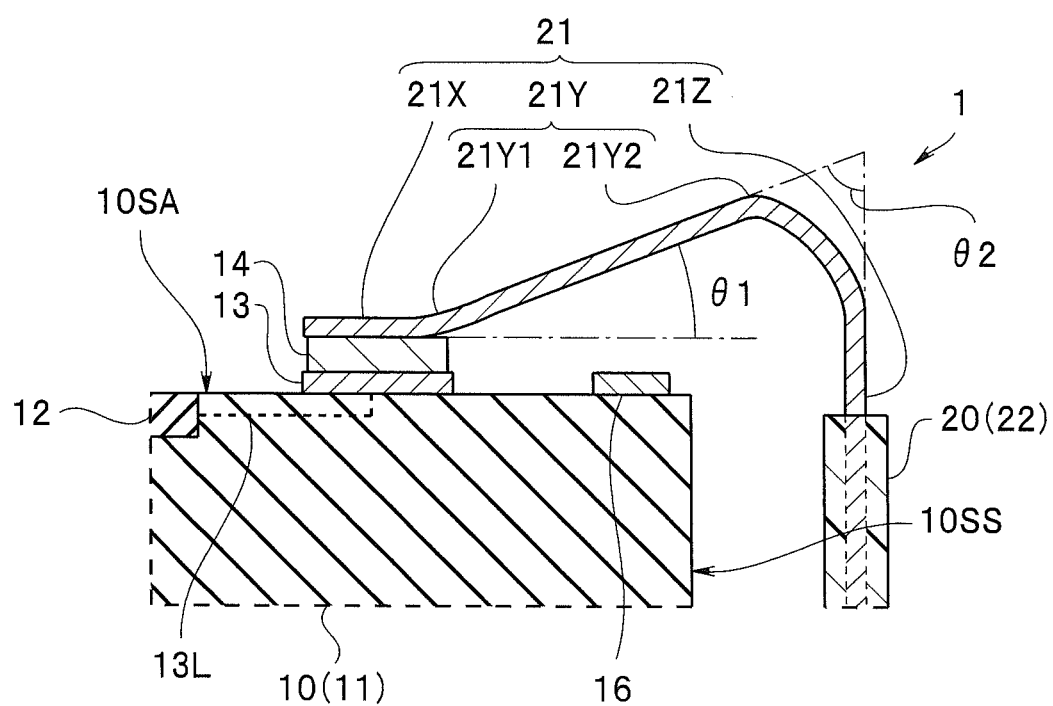
FIG. 3 is a cross-sectional view of the image pickup apparatus according to the first embodiment.

As illustrated in FIGS. 2 and 3, an image pickup apparatus 1 according to the present embodiment includes an image pickup device 10 and a flexible wiring board (hereinafter referred to as "wiring board") 20. An optical member or cover glass 30 is bonded to the image pickup device 10 via a bonding layer 31. Also, a part of bonding between the image pickup device 10 and the wiring board 20 is covered by a sealing resin 32. Note that description and illustration of the cover glass 30, the bonding layer 31 and the sealing resin 32 indicated by dotted lines may be omitted. Also, a direction of the light-receiving surface 10SA of the image pickup device 10 is referred to as "upward".

The image pickup device 10 is a substantially rectangular parallelepiped chip including semiconductor such as silicon. As described later, the image pickup device 10 is fabricated by cutting a semiconductor wafer on which a plurality of image pickup devices are formed by a known semiconductor process, into the individual image pickup devices. The image pickup device 10 includes, for example, a light-receiving surface 10SA of no less than 500 μm×500 μm and no more than 1000 μm×1000 μm, and has a thickness of no less than 100 μm and no more than 300 μm. In other words, the image pickup device 10 of the image pickup apparatus 1 to be disposed in, for example, a distal end portion of an endoscope is ultra-compact.

On an outer peripheral portion of the light-receiving surface 10SA of a semiconductor chip 11 in which a light-receiving section 12 is formed, a plurality of electrode pads 13 connected to the light-receiving section 12 respectively are provided in a row along an edge. On the electrode pads 13, bumps 14 are disposed. Although the light-receiving section 12 and the electrode pads 13 are electrically connected by inner wirings 13L, the light-receiving section 12 and the electrode pads 13 may be connected by surface wirings simultaneously with formation of the electrode pads 13.

The light-receiving section 12 includes a photoelectric conversion element such as a CCD or CMOS image pickup body. The bumps 14 are protruding gold bumps formed on the electrode pads 13, the bumps including a metal, for example, gold. For ensuring favorable bonding strength, a height of the bumps 14 together with the electrode pads 13 is preferably no less than 10 μm and no more than 100 μm, and a diameter of the bumps 14 is preferably no less than 30 μm and no more than 100 μm.

On the light-receiving surface 10SA of the image pickup device 10, a guard ring 16 including a conductive material such as copper is disposed along outer peripheral end portions. In the case of an ultra-compact image pickup device, chipping in a cutting step may affect the light-receiving section 12.

As described later, guard rings 16 are disposed on a semiconductor wafer along cutting lines in a wafer step. The guard rings 16 have the effect of, even if chipping occurs in a cutting step, preventing the light-receiving section 12 from being affected by the chipping. The guard rings 16 also have functions such as prevention of peeling of a surface protection film (not illustrated) and electric shielding of the image pickup device 10.

The wiring board 20 is a flexible wiring board including flexible resin such as polyimide as a base material 22 and a plurality of wirings 21L including, e.g., copper. Note that although the wirings 21L are disposed inside the base material 22, the wirings 21L may be disposed on a surface of the base material 22. Also, the wiring board 20 may be a multi-layer wiring board, electronic components such as chip capacitors may be mounted on a surface of the wiring board 20, or electronic components may be incorporated in the wiring board 20.

The wirings 21L protrude from the base material 22 at an end face of the wiring board 20 and thereby form inner leads 21. The inner leads 21 are also called as "flying leads". The inner leads 21 (wirings 21L) having, for example, a thickness of no less than 20 μm and no more than 50 μm and a length of no less than 50 μm and no more than 500 μm are flexible and plastically deform upon receipt of external stress. Note that the length of the inner leads 21 does not exceed the thickness of the image pickup device 10 plus 100 μm, for example, if the thickness of the image pickup device is no less than 100 μm and no more than 300 μm, the length of the inner leads 21 is preferably no less than 200 μm and no more than 400 μm.

As illustrated in FIG. 3, each of the inner leads 21 includes a distal end portion 21X, a bent portion 21Y and a rear end portion 21Z. In other words, a part of the inner lead 21, the part being press-bonded to the corresponding bump 14, is referred to as the distal end portion 21X, a bent part of the inner lead 21, the part extending from the distal end portion 21X, is referred to as the bent portion 21Y, and a part of the inner lead 21, the part extending from the bent portion 21Y and being arranged in parallel with a side face 10SS of the image pickup device 10, is referred to as the rear end portion 21Z. A length of the distal end portion 21X is no less than 30 μm and no more than 100 μm, which is equivalent to a size of the electrode pads 13. Note that, for the purpose of description, the bent portion 21Y and the rear end portion 21Z are distinguished from each other, but are integral with each other, and thus, a boundary between the bent portion 21Y and the rear end portion 21Z is not clear.

The bent portion 21Y includes a first bent portion 21Y1 bent upward so as to extend away from the light-receiving surface 10SA of the image pickup device 10 with a bonding part between the distal end portion 21X and the bump 14 as a starting point, and a second bent portion 21Y2 bent so that the rear end portion 21Z is parallel with the side face 10SS of the image pickup device 10. The first bent portion 21Y1 has a recess shape and the second bent portion 21Y2 is a protruding shape, relative to the light-receiving surface 10SA. Note that where a bending angle of the first bent portion 21Y1 is $\theta 1$ degrees, a bending angle $\theta 2$ of the second bent portion 21Y2 is approximately $(90-\theta 1)$ degrees.

As described above, the first bent portion 21Y1 is located above the light-receiving surface 10SA of the image pickup device 10, but the second bent portion 21Y2 is located at a position on the outer side relative to the light-receiving surface 10SA, a height of the position from the light-receiving surface 10SA being higher than that of the first bent portion 21Y1.

Each inner lead 21 is prevented from coming into contact with the guard ring 16, a corner portion and the side face 10SS of the image pickup device 10 because the first bent portion 21Y1 is bent in a recess shape with the bonding part as a starting point so as to extend away from the light-receiving surface 10SA.

The bending angle $\theta 1$ of the first bent portion 21Y1 is preferably no less than 10 degrees and no more than 70 degrees, particularly preferably no less than 30 degrees and no more than 60 degrees. If the guard ring 16 and any of the inner leads 21 come into contact with each other, a trouble occurs in transmission/reception of signals to/from the light-receiving section 12; however, as long as the bending angle $\theta 1$ falls within the aforementioned range, there is no risk of the inner leads 21 coming into contact with the guard ring 16, etc.

As illustrated in FIG. 2, in the image pickup apparatus 1, one wiring board 20 is bonded to the image pickup device 10. In other words, the plurality of bumps 14 are disposed in a row along one edge. However, a plurality of wiring boards 20 may be bonded to the image pickup device 10. For example, it is possible that: a plurality of bumps 14 are disposed in two rows along two edges facing each other; and two wiring boards are bonded to the image pickup device.

It is possible that no bumps 14 are disposed on the electrode pads 13 of the image pickup device 10; and the inner leads 21 are directly connected to the electrode pads 13.

The image pickup apparatus 1 has a small diameter because the inner leads 21 are provided so as to extend toward the side opposite to the light-receiving surface 10SA and substantially in parallel with the side face 10SS of the image pickup device 10. Consequently, an endoscope including the image pickup apparatus 1 disposed in a distal end portion of an insertion portion of the endoscope has a small diameter and thus is less invasive.

<Method for Manufacturing Image Pickup Apparatus 1>

Figure 4:
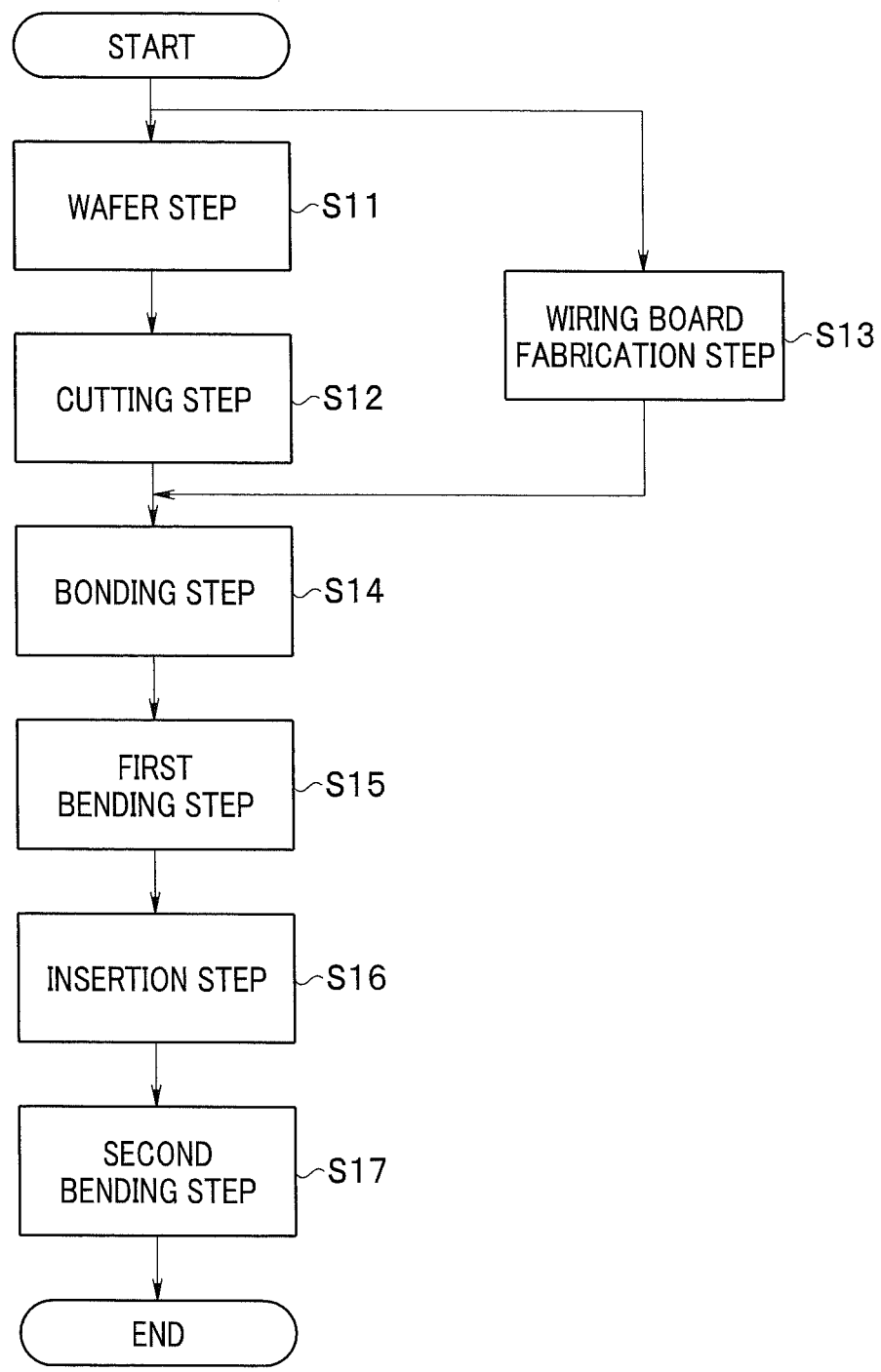
FIG. 4 is a flowchart of a method for manufacturing the image pickup apparatus according to the first embodiment.

Next, a method for manufacturing the image pickup apparatus 1 will be described with reference to the flowchart in FIG. 4.

<Step S11> Wafer Step

A semiconductor wafer (not illustrated) of, e.g., silicon, the semiconductor wafer including a plurality of light-receiving sections 12, a plurality of bumps 14 provided in rows and a guard ring 16 on peripheries of the respective light-receiving sections 12 on a light-receiving surface 10SA, is fabricated.

The bumps 14 are, for example, stud bumps or plated bumps. The stud bumps are fabricated by metal bonding gold balls formed as a result of distal ends of gold wires being melted by means of discharge, to the electrode pads 13 using a wire bonding apparatus and then cutting the wires.

<Step S12> Cutting Step

As a result of the semiconductor wafer being cut, an image pickup device 10 including a rectangular parallelepiped semiconductor is fabricated. The image pickup device 10 is a semiconductor chip 11 including a plurality of bumps 14 provided in a row on an outer peripheral portion of a light-receiving surface 10SA on which a light-receiving section 12 is formed, the plurality of bumps 14 being connected to the light-receiving section 12.

If the bumps 14 are stud bumps or the like, the bumps 14 may be disposed after the cutting of the semiconductor wafer.

<Step S13> Wiring Board Step

A wiring board 20 having predetermined specifications is fabricated. A plurality of inner leads 21 protrude from an end face of the wiring board 20. A disposition interval (pitch) of the plurality of inner leads 21 is the same as a disposition interval (pitch) of the bumps 14 of the image pickup device 10. Note that the wiring board 20 may be fabricated before steps S11 and S12.

<Step S14> Press Bonding Step

Figure 5A:
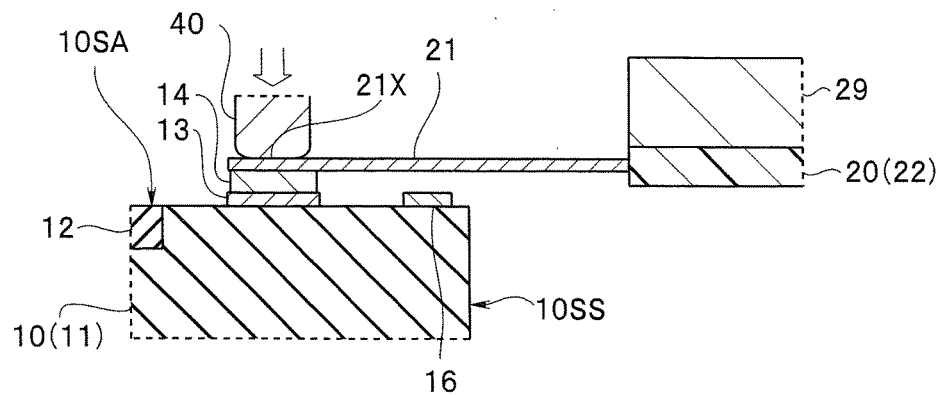
FIG. 5A is a cross-sectional view for describing the method for manufacturing the image pickup apparatus according to the first embodiment.

As illustrated in FIG. 5A, distal end portions 21X of the inner leads 21 and the bumps 14 are press-bonded using a press bonding tool 40. Note that it is preferable to use a rod-like press bonding tool 40 that enables a plurality of bumps 14 and a plurality of inner leads to be processed simultaneously. A rod-like press bonding tool 40 having a proper width that is necessary for pressing a plurality of bumps 14 simultaneously, but the press bonding tool 40 preferably has a width that is around the width of the image pickup device 10±100 μm.

Furthermore, it is preferable to perform heating during pressing, using a heat bar as a press bonding tool. Note that a heating temperature is set to be, for example, no less than 100° C. and no more than 400° C. and be less than a melting point of the material of the bumps 14, and thus, the bumps 14 are prevented from being melted. Instead of heat or in addition to heat, ultrasound may be applied to the press bonding tool.

Note that, as illustrated in, e.g., FIG. 5A, a holding member 29 is temporarily fixed to one surface of a base material 22 of the wiring board 20. The holding member 29, which includes a metal or a stiff resin, for example, sticks to and thereby detachably holds the base material 22 of the wiring board 20.

<Step S15> First Bending Step

Figure 5B:
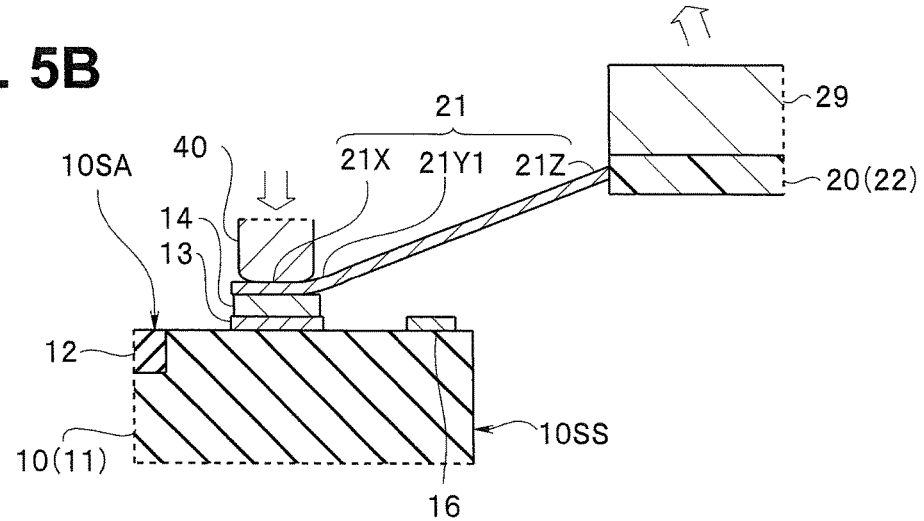
FIG. 5B is a cross-sectional view for describing the method for manufacturing the image pickup apparatus according to the first embodiment.

As illustrated in FIG. 5B, the holding member 29 is moved upward. In other words, the base material 22 of the wiring board 20 is moved upward together with the holding member 29. Then, the inner leads 21 are plastically deformed in such a manner that inner leads 21 are inclined upward relative to the light-receiving surface 10SA, with respective bonding parts between the inner leads 21 and the bumps 14 as starting points.

Note that, for bonding reliability ensuring, it is preferable that the inner leads 21 are bent while the bonding parts being press-bonded by the press bonding tool 40, with the image pickup device 10 set in a press bonding apparatus. Or, it is possible that: the bonding parts are sealed by a sealing resin to enhance bonding strength; and the inner lead 21 are then bent by moving the holding member 29 upward.

Note that, in order to avoid a strain from being imposed on the inner leads 21, it is preferable that the holding member 29 be not moved immediately upward (vertical direction), but be moved upward while the holding member 29 being gradually moved to the image pickup device 10 side. Then, it is particularly preferable that the holding member 29 is moved in such a manner that an end face of the base material 22, which correspond to rear ends of the inner leads 21, is arced with the bonding parts as a center because neither tensile stress nor compressive stress is applied to the bonding parts.

A rear end portion 21Z of each inner lead 21 is moved away from the light-receiving surface 10SA because of the first bent portion 21Y1 having a recess shape relative to the light-receiving surface 10SA.

<Step S16> Insertion Step

Figure 5C:
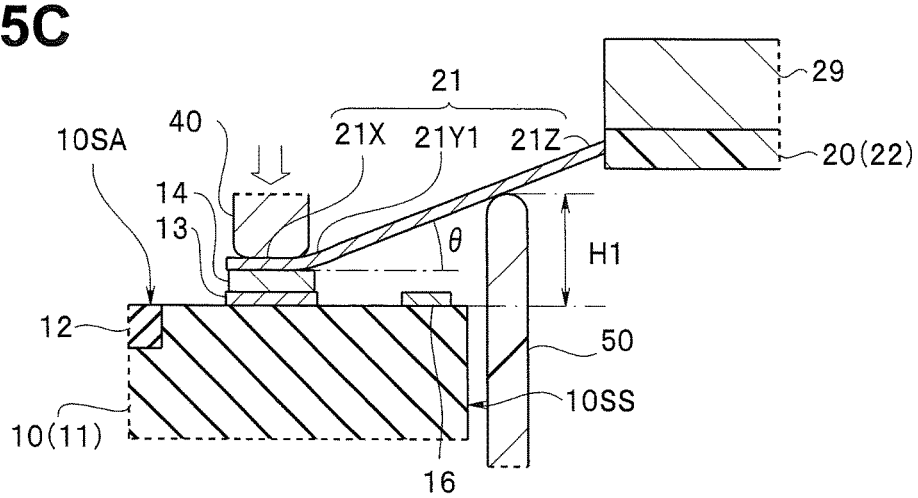
FIG. 5C is a cross-sectional view for describing the method for manufacturing the image pickup apparatus according to the first embodiment.

As illustrated in FIG. 5C, a bending assisting member 50 is inserted along a side face 10SS of the image pickup device 10 and a distal end of the bending assisting member 50 is brought into abutment with the inner leads 21.

Note that a protrusion amount H1 of protrusion of the bending assisting member 50 from the light-receiving surface 10SA, which is defined by an angle θ of the first bent portions 21Y1 and a distance from the first bent portions 21Y1 to an end face, is, for example, no less than 10 μm and no more than 100 μm.

The bending assisting member 50 has a plate-like shape so as to abut the plurality of inner leads 21, and a portion of the bending assisting member 50, the portion being to be brought into abutment with the inner leads 21, that is, the distal end of the bending assisting member 50, preferably includes a curved surface.

<Step S17> Second Bending Step

Figure 5D:
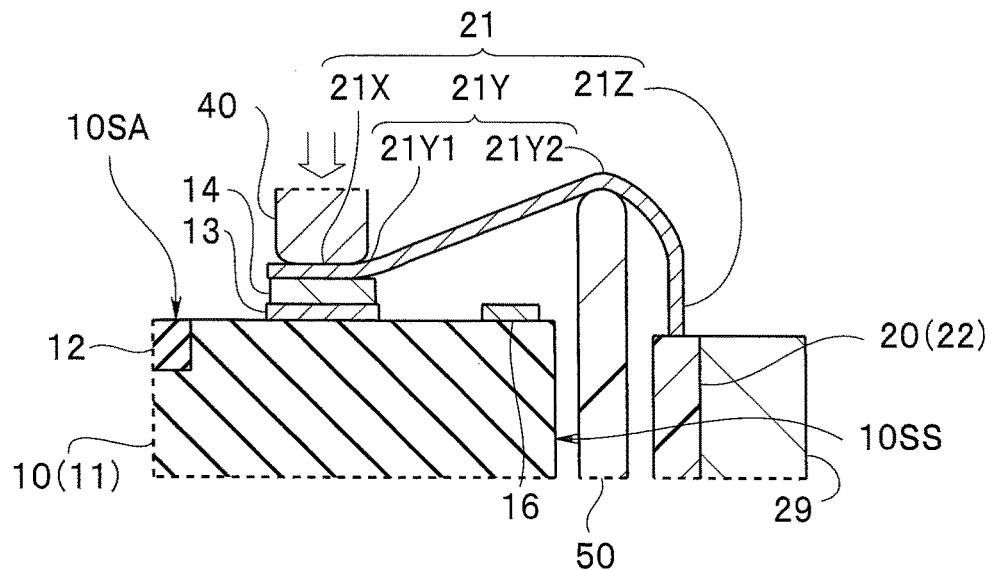
FIG. 5D is a cross-sectional view for describing the method for manufacturing the image pickup apparatus according to the first embodiment.

As illustrated in FIG. 5D, the plurality of inner leads 21 are simultaneously bent with respective portions of the plurality of inner leads 21, the portions being in abutment with the bending assisting member 50, as apexes, so that the rear end portions 21Z of the inner leads 21, that is, the base material 22 held by the holding member 29 are parallel to the side face 10SS of the image pickup device 10. Then, the inner leads 21 are plastically deformed, whereby second bent portions 21Y2 having a protrusion shape are formed.

The bending assisting member 50 prevents the inner leads 21 from coming into contact with a guard ring 16, a corner portion and the side face 10SS of the image pickup device 10.

As in the first bending step, in the second bending step, it is preferable that the inner leads 21 are bent while the bonding parts being press-bonded by the press bonding tool 40. Also, the inner leads 21 may be bent after the bonding parts are sealed by a resin. In this case, a bending assisting member need not be used.

Figure 5E:
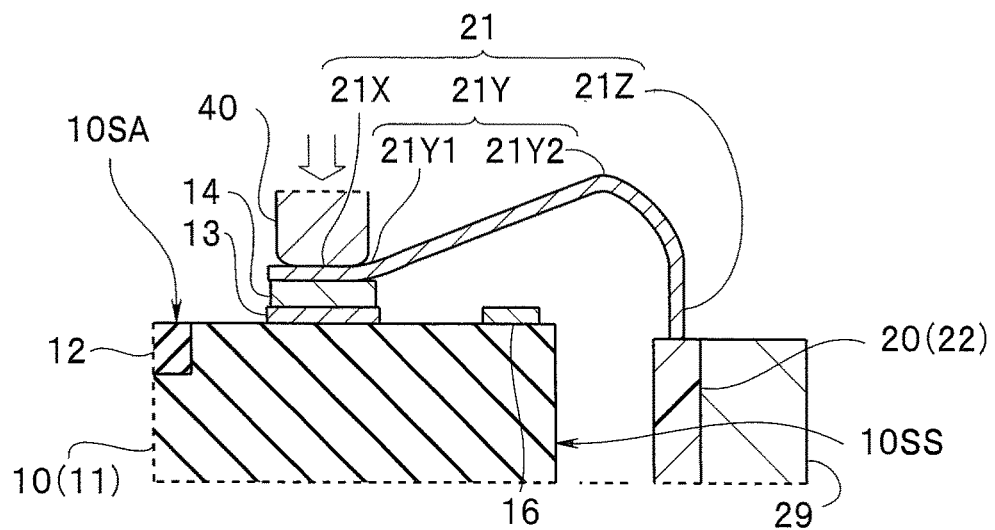
FIG. 5E is a cross-sectional view for describing the method for manufacturing the image pickup apparatus according to the first embodiment.

As illustrated in FIG. 5E, upon end of the second bending step, the bending assisting member 50 is removed from between the side face 10SS of the image pickup device 10 and the inner leads 21. Also, the image pickup apparatus 1 is detached from the press bonding apparatus, and the holding member 29 is removed.

Note that, after the bonding, the bonding parts may be sealed by a sealing resin. Furthermore, the base material 22 of the flexible wiring board 20 may be bonded to the side face 10SS of the image pickup device 10 via, e.g., an adhesive. Also, if the rear end portions 21Z of the inner leads 21 are long, the rear end portions 21Z may be sealed by a resin so as to cover the side face 10SS.

In the method for manufacturing the image pickup device 10, the use of the bending assisting member 50 when the inner leads 21 are bent substantially in parallel with the side face 10SS of the image pickup device 10 makes it easy to bend the inner leads 21 substantially to a right angle without the inner leads 21 coming into contact with the image pickup device 10.

Second Embodiment

An image pickup apparatus 1A and a method for manufacturing the image pickup apparatus 1A according to a second embodiment are similar to those of the image pickup apparatus 1, etc., and thus components having same functions as those of the image pickup apparatus 1, etc., are provided with same reference signs as those of the image pickup apparatus 1, etc., and description of the components will be omitted.

Figure 6:
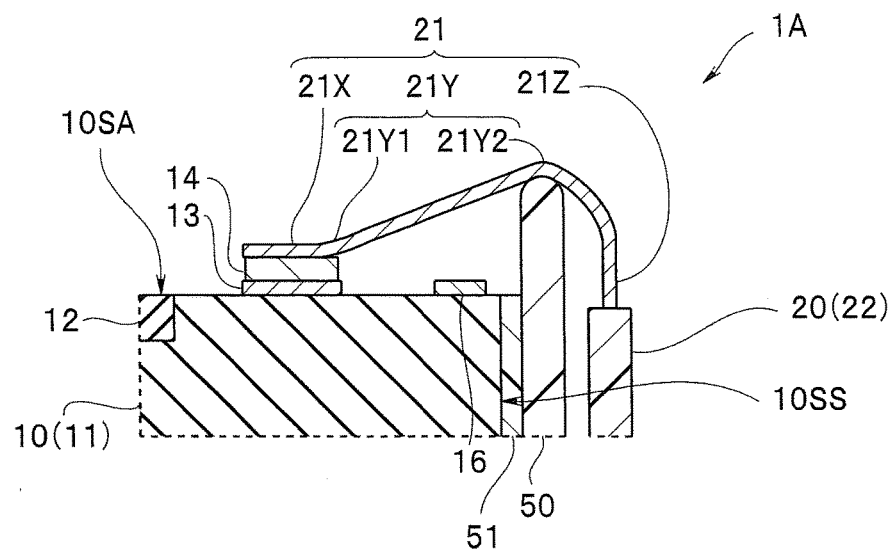
FIG. 6 is a cross-sectional view of an image pickup apparatus according to a second embodiment.

As illustrated in FIG. 6, in the image pickup apparatus 1A, a bending assisting member 50 is bonded to a side face of an image pickup device 10 via a bonding layer 51. In other words, in the method for manufacturing the image pickup apparatus 1A, in an insertion step, the bending assisting member 50 is bonded to the side face 10SS of the image pickup device 10.

The bending assisting member 50 includes an insulator such as resin. Note that the bending assisting member 50 may be a conductor such as metal or a semiconductor such as silicon as long as at least a distal end portion of the bending assisting member 50, the distal end portion being to be in contact with inner leads 21, is covered by an insulator.

The image pickup apparatus 1A has the effect of the image pickup apparatus 1, and furthermore, the fixing of the bending assisting member 50 facilitates bending and prevents the inner leads 21 from coming into contact with the image pickup device 10, etc., even after the image pickup apparatus 1A being detached from a press bonding apparatus.

Third Embodiment

An image pickup apparatus 1B and a method for manufacturing the image pickup apparatus 1B according to a third embodiment are similar to those of the image pickup apparatus 1, etc., and thus components having same functions as those of the image pickup apparatus 1, etc., are provided with same reference signs as those of the image pickup apparatus 1, etc., and description of the components will be omitted.

Figure 7:
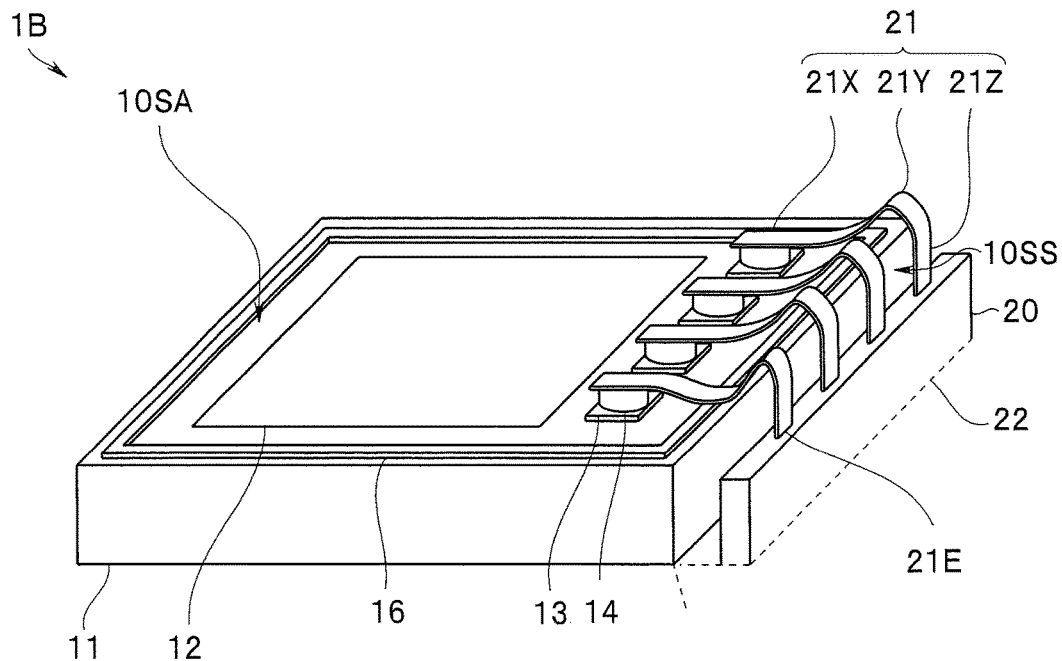
FIG. 7 is a perspective view of an image pickup apparatus according to a third embodiment.

As illustrated in FIG. 7, in the image pickup apparatus 1B, an inner lead 21E having a ground potential from among a plurality of inner leads 21 is connected to a guard ring 16 by means of press bonding.

In the image pickup apparatus 1B, a sealing function is enhanced as a result of the guard ring 16 having a ground potential. Also, the manufacture is easy because the guard ring 16 is made to have a ground potential using the inner lead 21E.

Fourth Embodiment

An image pickup apparatus 1C and a method for manufacturing the image pickup apparatus 1C according to a fourth embodiment are similar to those of the image pickup apparatus 1, etc., and thus components having same functions as those of the image pickup apparatus 1, etc., are provided with same reference signs as those of the image pickup apparatus 1, etc., and description of the components will be omitted.

Figure 8:
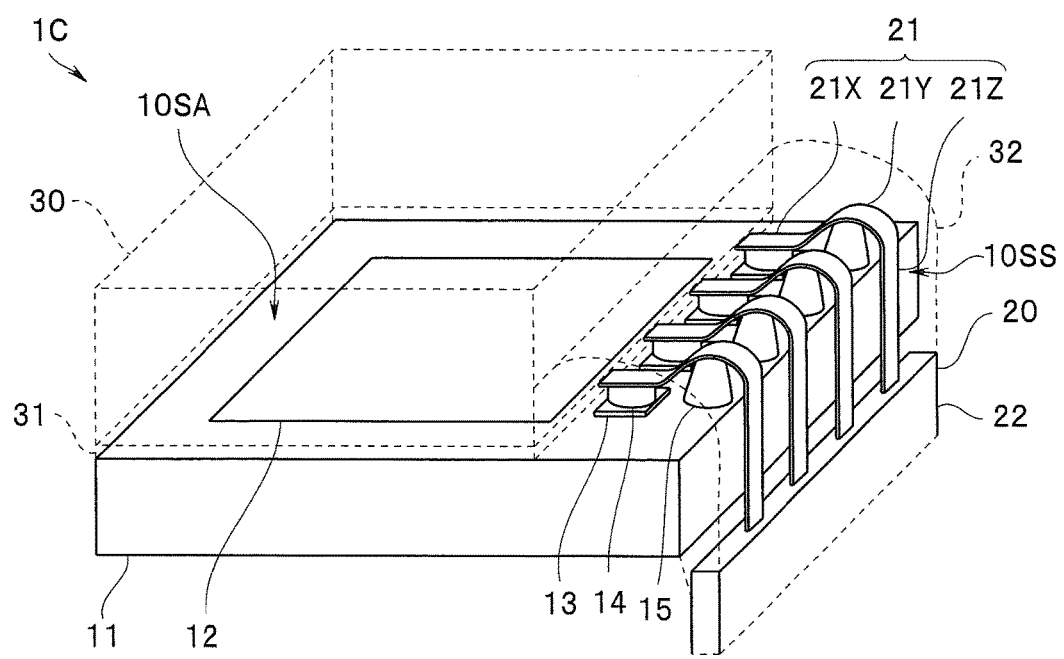
FIG. 8 is a perspective view of an image pickup apparatus according to a fourth embodiment.
Figure 9:
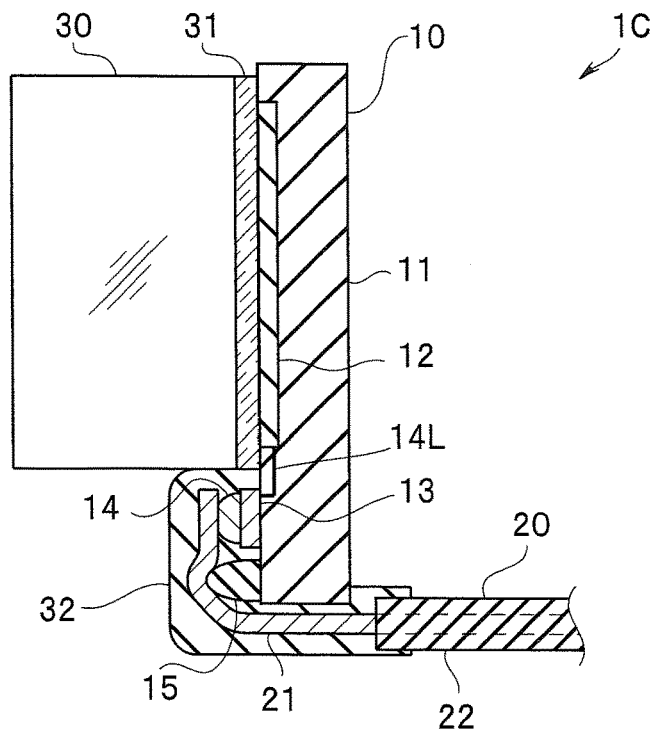
FIG. 9 is a cross-sectional view of the image pickup apparatus according to the fourth embodiment.
Figure 10:
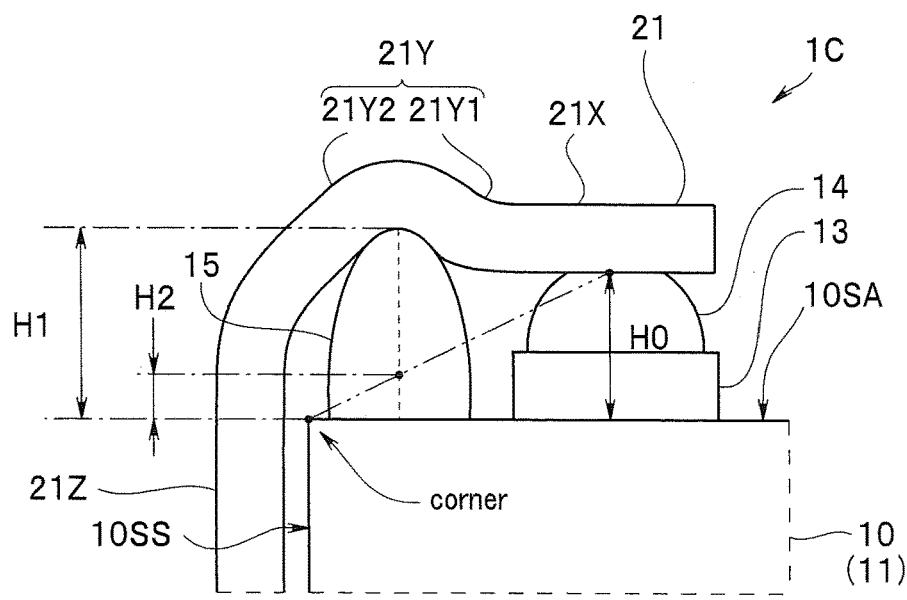
FIG. 10 is a side view for describing insulating members in the image pickup apparatus according to the fourth embodiment.

As illustrated in FIGS. 8 to 10, in the image pickup apparatus 1C, a plurality of insulating members 15 having a protrusion shape and including, e.g., a resin, insulating members 15 being disposed on extensions of respective shortest straight lines connecting a light-receiving section 12 and respective bumps 14, are disposed on a light-receiving surface 10SA of a semiconductor chip 11. The insulating members 15 are projection members that prevent contact between the inner leads 21 and an image pickup device 10.

An optimum value of a height H1 of the insulating members 15 varies depending on a height H0 of the bumps 14 and a position of the bumps 14 from an end face. Note that, as illustrated in FIG. 10, the height H0 of the bumps 14 is not a height of the bumps alone, but a height of the bumps 14 from the light-receiving surface 10SA and thus a thickness of electrode pads (bonding pads) 13 is taken into account.

The height H1 of each bump 14 is set to be no less than twice, preferably, no less than three times a height H2, from the light-receiving surface 10SA, of a point at which a straight line connecting an apex of the bump 14 and a corner portion of the semiconductor chip 11 intersects a center line of a corresponding insulating member 15. As long as the height H1 is no more than ten times the height H2, bent portions 21Y are prevented from deforming overly.

For example, if the height H0 of the bumps 14 is no less than 10 μm and no more than 100 μm, the height H1 of the insulating members 15 is no less than 1 μm, preferably, no less than 10 μm and no more than 150 μm.

In the image pickup apparatus 1C, as in the image pickup apparatus 1, etc., each bent portion 21Y includes a first bent portion 21Y1 bent upward so as to extend away from the light-receiving surface 10SA of the image pickup device 10 with a bonding part between a distal end portion 21X and the corresponding bump 14 as a starting point, and a second bent portion 21Y2 bent so that the rear end portion 21Z is parallel with a side face loss of the image pickup device 10.

In the image pickup apparatus 1C, the bent portions 21Y of the inner leads 21 are in abutment with the insulating members 15. Thus, although the inner leads 21 are bent substantially to a right angle, the inner leads 21 are prevented from coming into contact with the corner portion and the side face 10SS of the image pickup device 10.

The image pickup apparatus 1C has a small diameter because the inner leads 21 are provided so as to extend toward the side opposite to the light-receiving surface 10SA and substantially in parallel with the side face 10SS of the image pickup device 10. Consequently, an endoscope including the image pickup apparatus 1C disposed in a distal end portion of an insertion portion of the endoscope has a small diameter and thus is less invasive.

<Method for Manufacturing Image Pickup Apparatus 1C>

Figure 11:
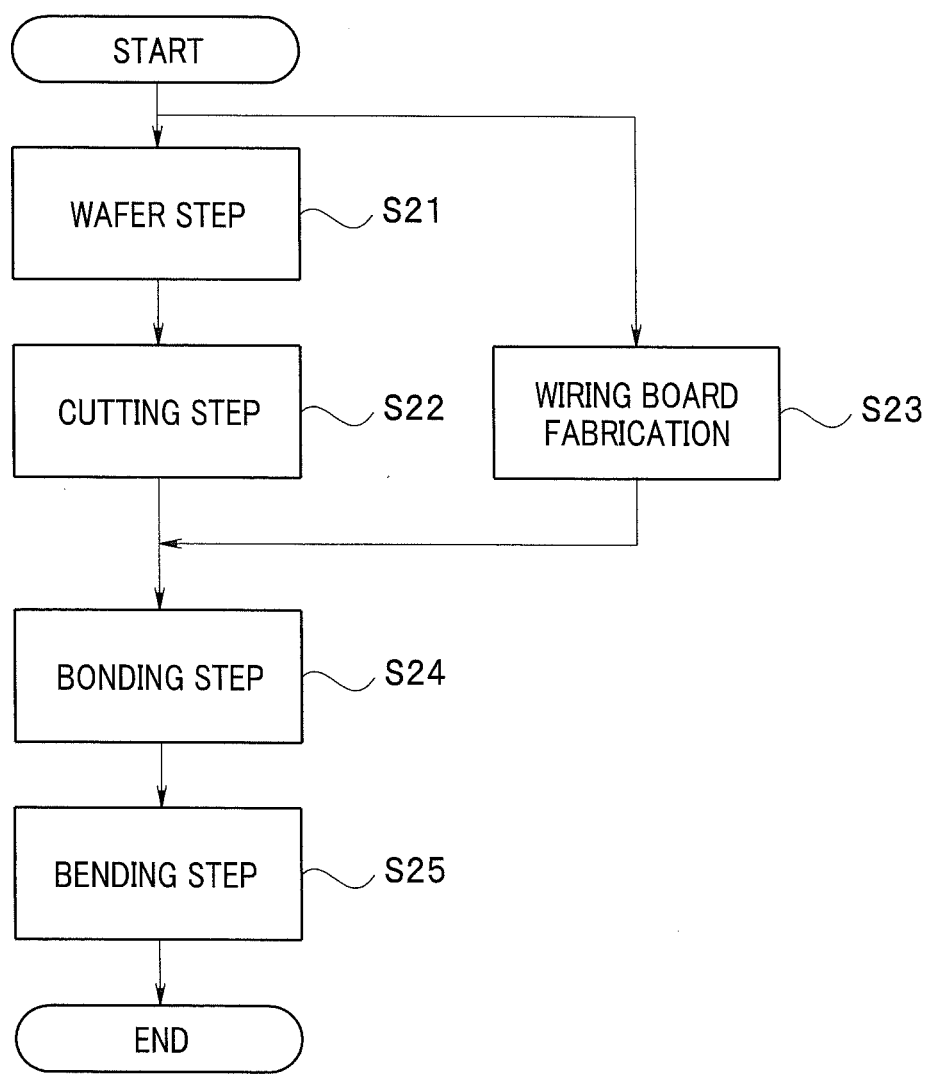
FIG. 11 is a flowchart for describing a method for manufacturing the image pickup apparatus according to the fourth embodiment.

Next, a method for manufacturing the image pickup apparatus 1C will be described with reference to the flowchart in FIG. 11.

<Step S21> Wafer Step

Figure 12:
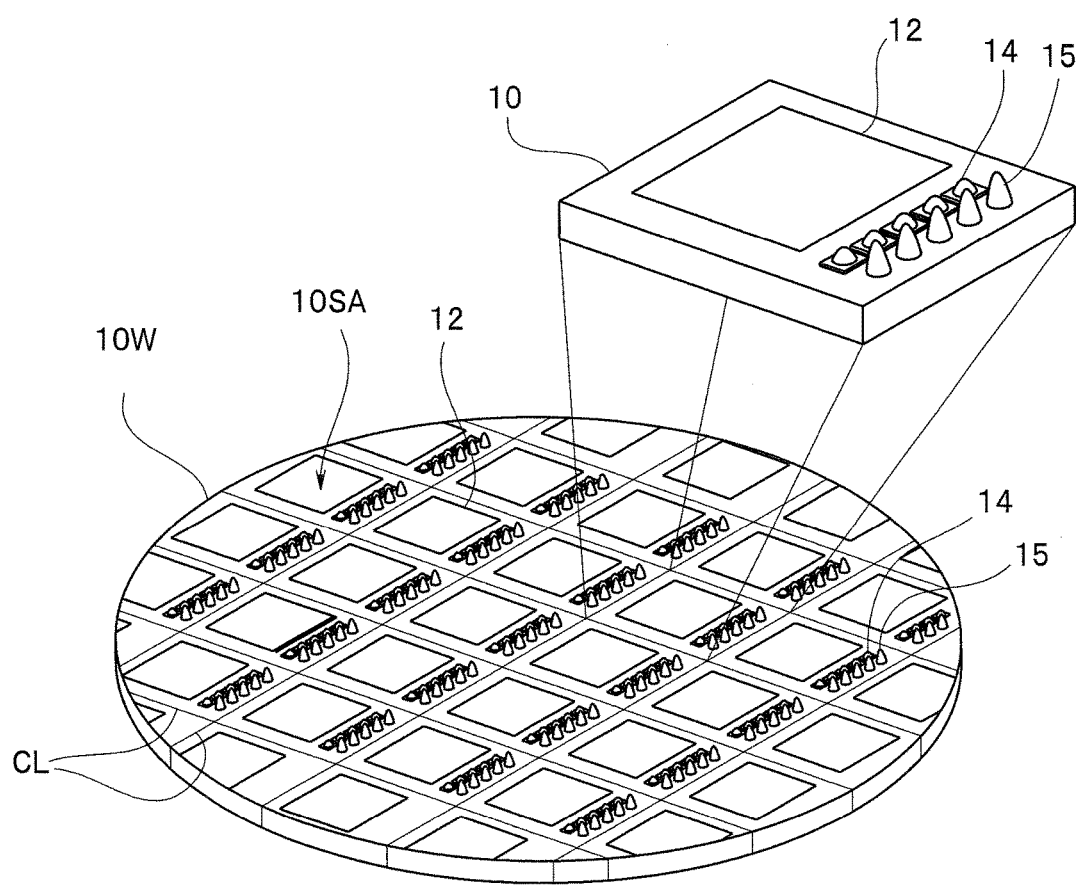
FIG. 12 is a perspective view for describing the method for manufacturing the image pickup apparatus according to the fourth embodiment.

As illustrated in FIG. 12, a semiconductor wafer 10W of, e.g., silicon, the semiconductor wafer 10W including a plurality of light-receiving sections 12, and a plurality of bumps 14 (electrode pads 13) and a plurality of insulating member 15 provided in a row on a periphery of each light-receiving section 12 on a light-receiving surface 10SA, is fabricated. Note that reference sign CL in FIG. 12 denotes cutting lines for a cutting step.

The bumps 14 are, for example, stud bumps or plated bumps. The stud bumps are fabricated by metal bonding gold balls formed as a result of distal ends of gold wires being melted by discharge, to the electrode pads 13 using a wire bonding apparatus and then cutting the wires.

The insulating members 15 may have a polytope shape such as a rectangular parallelepiped shape, a columnar shape, a conical shape or a triangular pyramid shape as long as such shape is a protrusion shape having a predetermined height H1 as already described. However, an upper surface of each insulating member 15 is preferably a curved surface, for example, a semispherical shape for ease of bending of the corresponding inner lead 21 that is in abutment with the insulating member 15.

For the insulating members 15, an insulating material property such as resin, ceramic or glass can be used, but resin that is easy to process is preferable. For the resin, e.g., polyimide, acrylic, epoxy, silicone, BCB or rubber is used. For each insulating member 15, a conductive material, at least a part of which, the part being to be in contact with the corresponding inner lead 21, is covered by an insulating material, can be used.

The plurality of insulating members 15 in a plurality of image pickup devices 10 are preferably disposed in a lump in the wafer step. For example, insulating members 15 including bakelite can easily be disposed by patterning a novolac photoresist into rectangular parallelepipeds, subsequently performing heat treatment to form the rectangular parallelepipeds into semispherical shapes, and furthermore performing hardening treatment. Or, the insulating members 15 may be disposed by patterning, e.g., polyimide resin.

<Step S22> Cutting Step

As a result of the semiconductor wafer 10W being cut, an image pickup device 10 including a rectangular parallelepiped semiconductor is fabricated. The image pickup device 10 is a semiconductor chip 11 including a plurality of bumps 14, the plurality of bumps 14 being connected to a light-receiving section 12, and a plurality of insulating members 15 provided in a row on an outer peripheral portion of a light-receiving surface 10SA on which the light-receiving section 12 is formed.

If the bumps 14 are stud bumps or the like, the bumps 14 may be disposed after the cutting of the semiconductor wafer 10W. Also, the insulating members 15 may be disposed after the semiconductor wafer 10W is cut into individual image pickup devices 10. In this case, the insulating members 15 may be disposed by dropping a resin solution from a dispenser or may be disposed by, e.g., an ink-jet method.

<Step S23> Wiring Board Step

A wiring board 20 having predetermined specifications is fabricated. A plurality of inner leads 21 protrude from an end face of the wiring board 20. A disposition interval (pitch) of the plurality of inner leads 21 is the same as a disposition interval (pitch) of the bumps 14 of the image pickup device 10. Note that the wiring board 20 may be fabricated before steps S21 to S24.

<Step S24> Press Bonding Step

Figure 13A:
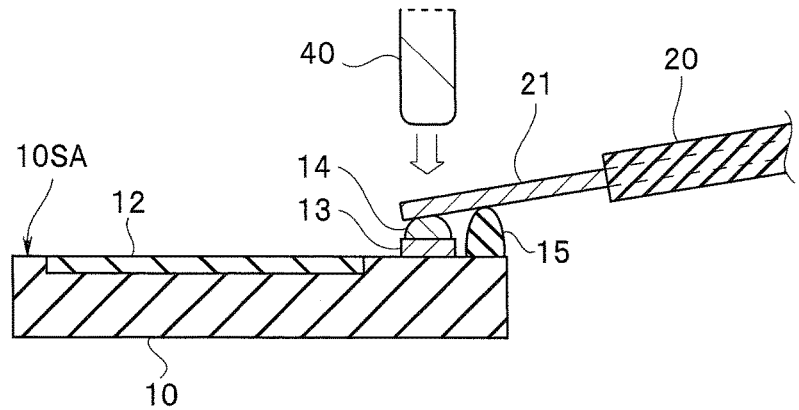
FIG. 13A is a cross-sectional view for describing the method for manufacturing the image pickup apparatus according to the fourth embodiment.

As illustrated in FIG. 13A, distal end portions of the inner leads 21 and the bumps 14 are press-bonded using a press bonding tool 40. Note that it is preferable to use a rod-like press bonding tool that enables a plurality of bumps and a plurality of inner leads to be processed simultaneously.

Furthermore, it is preferable to perform heating during pressing, using a heat bar as a press bonding tool. Note that a heating temperature is set to be, for example, no less than 100° C. and no more than 400° C. and be less than a melting point of a material of the bumps 14, and thus, the bumps 14 are prevented from being melted. Instead of heat or in addition to heat, ultrasound may be applied to the press bonding tool.

Figure 13B:
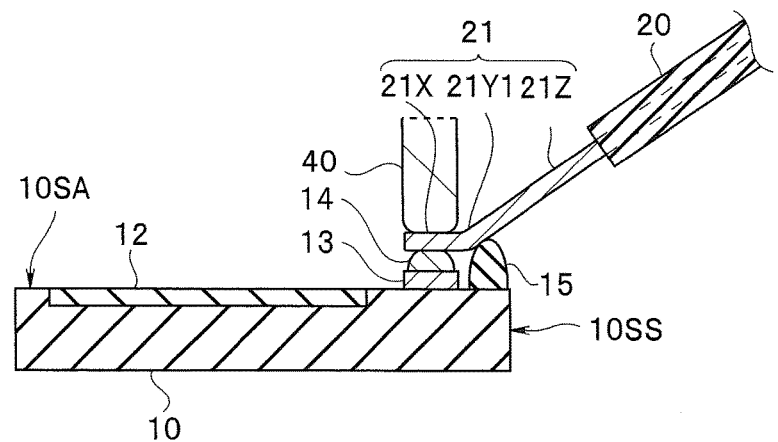
FIG. 13B is a cross-sectional view for describing the method for manufacturing the image pickup apparatus according to the fourth embodiment.

Note that, as illustrated in FIG. 13B, if a height H1 of the insulating members 15 is higher than a height H0 of the bumps 14, the inner leads 21 come into contact with the insulating members 15. Thus, the inner leads 21 are plastically deformed into a recess shape relative to the light-receiving surface 10SA with respective bonded end faces as base starting points.

<Step S25> Bending Step

Figure 13C:
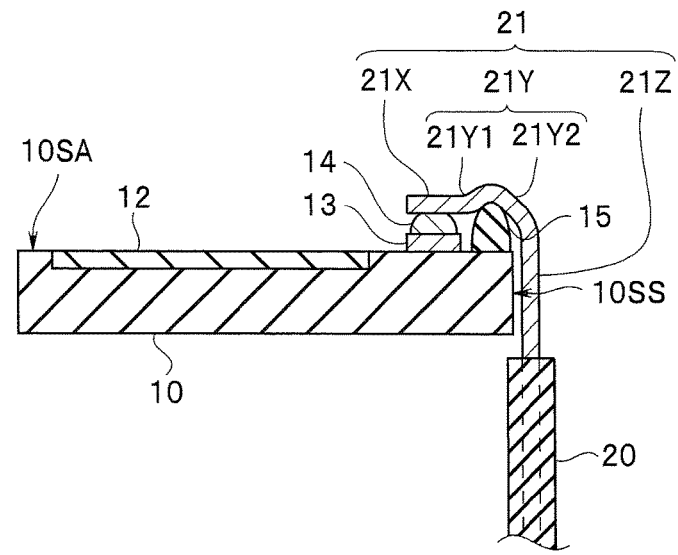
FIG. 13C is a cross-sectional view for describing the method for manufacturing the image pickup apparatus according to the fourth embodiment.

As illustrated in FIG. 13C, rear end portions 21Z of the inner leads 21 are bent so as to be disposed substantially in parallel with a side face 10SS of the image pickup device 10.

Note that, the inner leads 21 may be bent while respective bonding parts being pressed by the press bonding tool 40, with the image pickup device 10 set in a press bonding apparatus.

According to the method for manufacturing the image pickup device 10, when the inner leads 21 are bent so as to be substantially parallel with the side face 10SS of the image pickup device 10, the inner leads 21 come into abutment with the insulating members 15, making it easy to bend the inner leads 21 so as not come into contact with the image pickup device 10.

Fifth Embodiment

An image pickup apparatus 1D and a method for manufacturing the image pickup apparatus 1D according to a fifth embodiment are similar to those of the image pickup apparatus 1C, etc., and thus components having same functions as those of the image pickup apparatus 1C, etc., are provided with same reference signs as those of the image pickup apparatus 1C, etc., and description of the components will be omitted.

Figure 14:
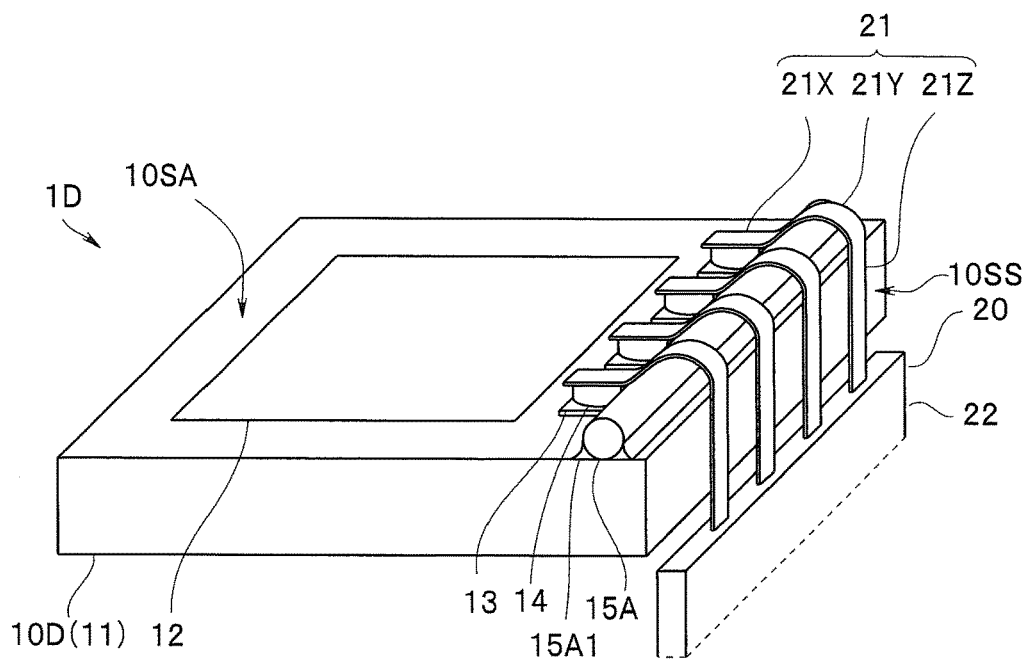
FIG. 14 is a perspective view of an image pickup apparatus according to a fifth embodiment.

As illustrated in FIG. 14, in the image pickup apparatus 1D, an insulating member 15A has a rod-like shape with which a plurality of inner leads 21 are in abutment. The insulating member 15A, which is a rod-like member including, e.g., glass or resin, is fixed to a semiconductor chip 11 via a bonding layer 15A1. Note that, as the insulating member 15A, a conductive material such as a metal rod, at least a part of which, the part being to be in contact with the inner leads 21, is covered by an insulating material, may be used.

The rod-like insulating member 15A may be disposed on a side face 10SS of the image pickup device 10D or a corner portion of the image pickup device 10D.

As with the insulating members 15 in the image pickup apparatus 1C, it is preferable that the insulating member 15A be disposed in a wafer step. For example, disposition of an elongated insulating member extending across a plurality of image pickup apparatuses on a semiconductor wafer 10W enables the elongated insulating member to provide insulating members 15A in respective image pickup devices 10D in a cutting step.

The image pickup apparatus 1D has the effect of the image pickup apparatus 1C and furthermore, can easily be manufactured because only one insulating member 15A is disposed. In particular, disposition of the insulating member 15A in the wafer step makes the manufacture easier.

Note that the insulating member 15A may be removed after the inner leads 21 are bent.

Sixth Embodiment

An image pickup apparatus 1E and a method for manufacturing the image pickup apparatus 1E according to a sixth embodiment are similar to those of the image pickup apparatus 1, etc., and thus components having same functions as those of the image pickup apparatus 1, etc., are provided with same reference signs as those of the image pickup apparatus 1, etc., and description of the components will be omitted.

Figure 15:
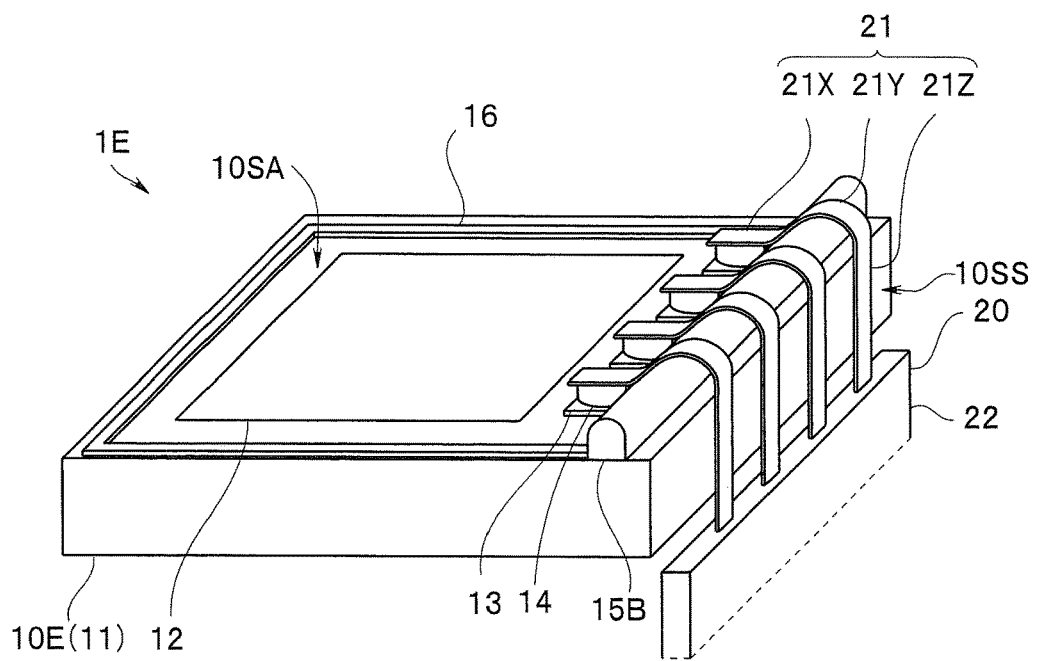
FIG. 15 is a perspective view of an image pickup apparatus according to a sixth embodiment.
Figure 16:
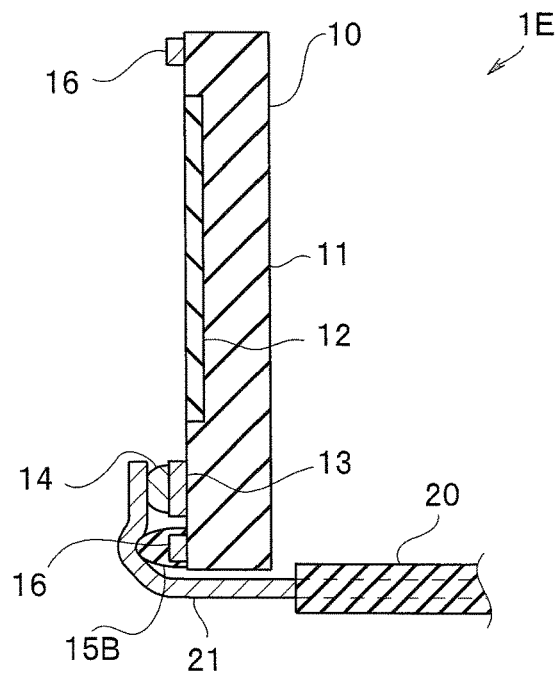
FIG. 16 is a cross-sectional view of the image pickup apparatus according to the sixth embodiment.

As illustrated in FIGS. 15 and 16, an image pickup device 10E in an image pickup apparatus 1E includes a guard ring 16, which includes a conductive material such as copper, on a light-receiving surface 10SA along an outer peripheral end portion of the image pickup device 10E. In the case of an ultra-compact image pickup device, chipping in a cutting step may affect the light-receiving section 12.

Guard rings 16 are disposed along respective cutting lines CL on a semiconductor wafer 10W in a wafer step. For example, when electrode pads 13 are disposed, guard rings 16 can be disposed by performing patterning simultaneously with patterning for the electrode pads 13, using a same material.

The guard rings 16 have an effect of, even if chipping occurs in a cutting step, preventing the respective light-receiving sections 12 from being affected by the chipping. The guard rings 16 also have functions such as prevention of peeling of a surface protection film (not illustrated) and electric shielding of the image pickup device 10E.

If a guard ring 16 and any of inner leads 21 are brought into contact with each other, a trouble occurs in transmission/reception of signals to/from the light-receiving section 12; however, since in the image pickup apparatus 1E, an elongated rod-like insulating member 15B covers the guard ring 16, there is no risk of the inner leads 21 being brought into contact with the guard ring 16. It is a matter of course that the insulating member 15B does not need to cover an entire periphery of the guard ring 16 and only needs to be disposed on an area of the guard ring 16, the area having a risk of coming in contact with the inner leads 21.

The image pickup apparatus 1E has the effects of the image pickup apparatus 1C, etc., and further is highly reliable because of the provision of the guard ring 16.

Seventh Embodiment

An image pickup apparatus 1F and a method for manufacturing the image pickup apparatus 1F according to a seventh embodiment are similar to those of the image pickup apparatus 1C, etc., and thus components having same functions as those of the image pickup apparatus 1C, etc., are provided with same reference signs as those of the image pickup apparatus 1C, etc., and description of the components will be omitted.

Figure 17:
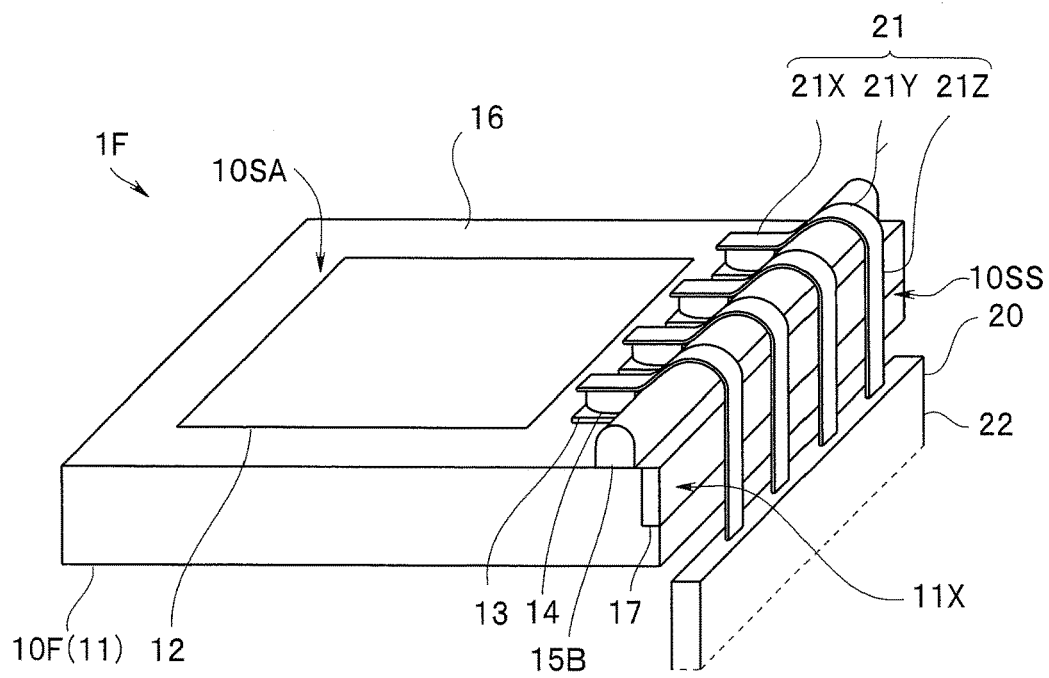
FIG. 17 is a perspective view of an image pickup apparatus according to a seventh embodiment.

As illustrated in FIG. 17, in the image pickup apparatus 1F, an upper portion (corner portion) of a side face 10SS of a semiconductor chip 11F is an insulation portion 17 including an insulator. In other words, the semiconductor chip 11F includes a cutout portion 11X, and the cutout portion 11X is filled with resin. The insulation portion 17 includes, for example, a material that is the same as that of an insulating member 15B, etc.

The image pickup apparatus 1F has the effects of the image pickup apparatus 1C, etc., and is less likely to cause a short circuit between inner leads 21 and the image pickup device 10F because the corner portion of the image pickup device 10F with which the inner leads 21 are most likely to come into contact is the insulation portion 17.

Figure 18A:
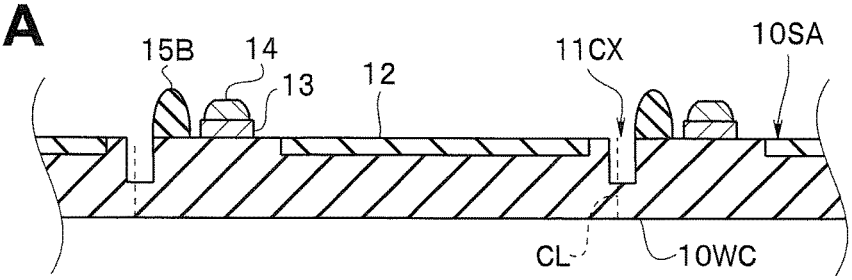
FIG. 18A is a cross-sectional view for describing a method for manufacturing the image pickup apparatus according to the seventh embodiment.
Figure 18B:
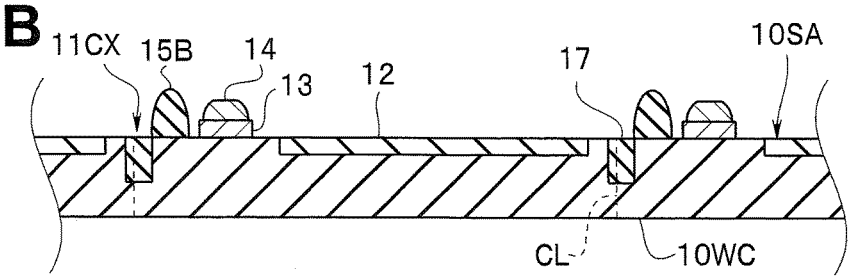
FIG. 18B is a cross-sectional view for describing the method for manufacturing the image pickup apparatus according to the seventh embodiment.

The cutout portion 11X and the insulation portion 17 of the image pickup device 10F in the image pickup apparatus 1F is fabricated in a wafer step. In other words, as illustrated in FIG. 18A, in the wafer step, grooves 11CX are formed in a light-receiving surface 10SA of a semiconductor wafer 10WC along cutting lines CL that are parallel with a direction of rows of a plurality of bumps 14 from among cutting lines for a cutting step. The grooves 11CX are formed by means of, for example, half-cut dicing or etching. Then, as illustrated in FIG. 18B, resin is charged into the grooves 11CX and is subjected to hardening treatment. For the resin, any of various materials that are similar to that of the insulating member 15B is used.

Note that the inside of each groove 11CX does not need to be completely filled with the resin. For example, a surface of the resin inside the groove 11CX may be recessed because of, e.g., contraction during the hardening.

Also, simultaneously with disposition of the insulating members 15B on the light-receiving surface 10SA, resin may be charged into the grooves 11CX, using a material that is the same as that of the insulating members 15, for example, a photoresist. Also, when resin is charged into the grooves 11CX, resin may be disposed so as to be higher than respective upper surfaces of the grooves 11CX to form insulating members 15 having a shape protruding from the light-receiving surface 10SA.

Figure 18C:
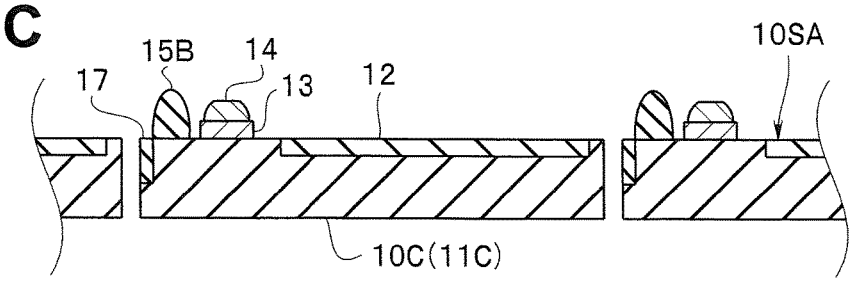
FIG. 18C is a cross-sectional view for describing the method for manufacturing the image pickup apparatus according to the seventh embodiment.

Then, in the cutting step, as illustrated in FIG. 18C, cutting is performed along the cutting lines CL, whereby an image pickup device 10F including a semiconductor chip 11F in which a cutout portion 11X is provided at a corner portion and an insulation portion 17 is formed by charging resin into the cutout portion 11X is fabricated.

The image pickup apparatus 1F can easily be manufactured because in the wafer step, the insulation portion 17 is disposed at a part that is to be the corner portion of the image pickup device 10F. Also, the insulation portion 17 does not increase an outer dimension (outer diameter) of the image pickup device 10F and thus the image pickup apparatus 1F has a small diameter.

Modification of Seventh Embodiment

Figure 19:
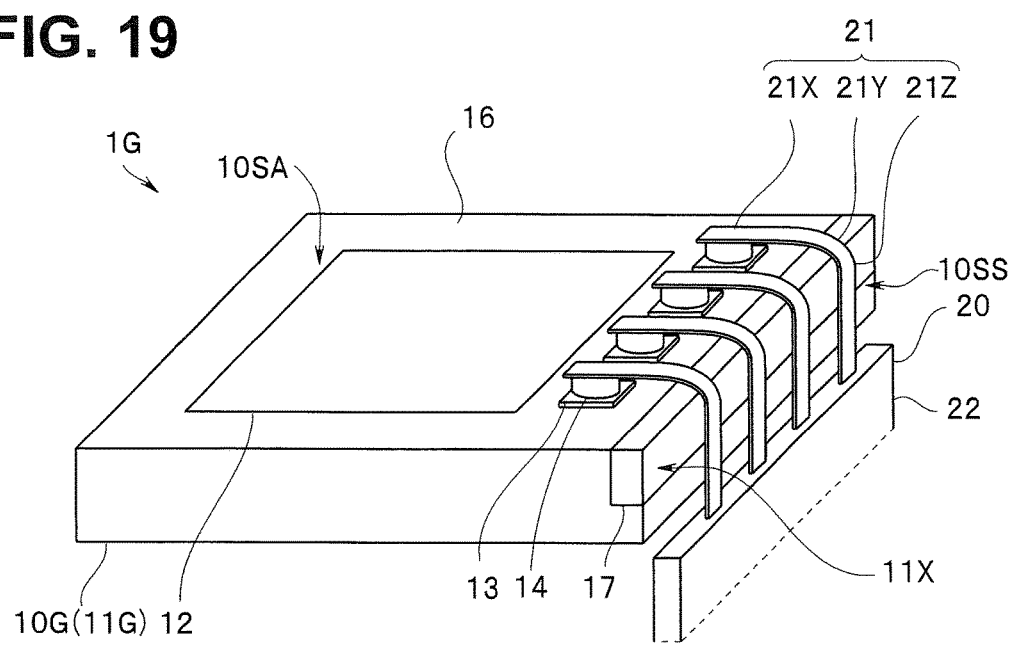
FIG. 19 is a cross-sectional view of an image pickup apparatus according to a modification of the seventh embodiment.

As illustrated in FIG. 19, an image pickup apparatus 1G according to a modification of the seventh embodiment is similar to the image pickup apparatus 1F, but includes no insulating member on a light-receiving surface 10SA.

In other words, the image pickup apparatus 1G includes a cutout portion 11X at a corner portion of a semiconductor chip 11G and an insulation portion 17 formed by charging resin into the cutout portion 11X.

The image pickup apparatus 1G has no risk of a short circuit between inner leads 21 and a guard ring 16 even if the inner leads 21 are bent substantially to a right angle while the inner leads 21 being brought into abutment with the corner portion.

Figure 20:
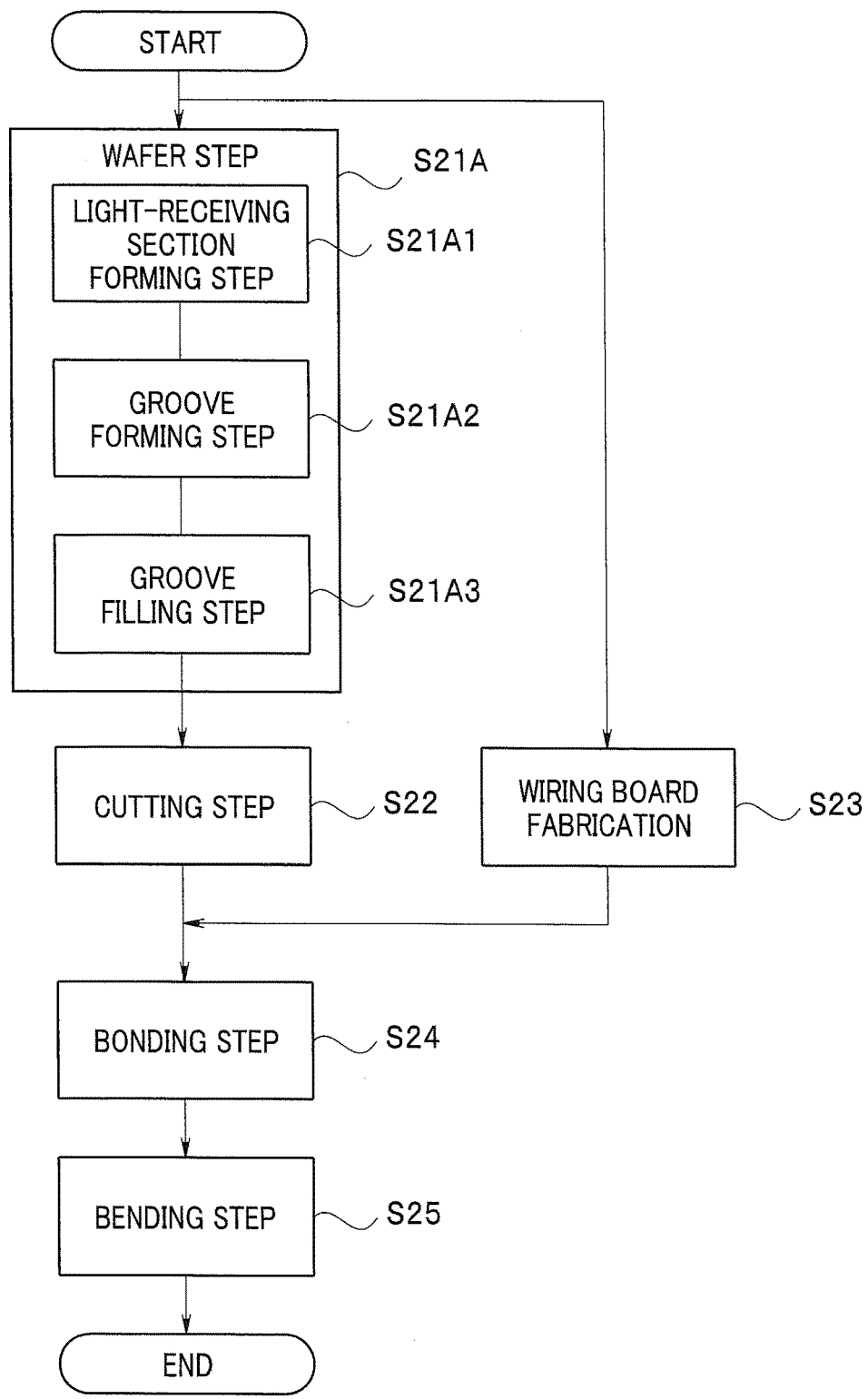
FIG. 20 is a flowchart for describing a method for manufacturing the image pickup apparatus according to the modification of the seventh embodiment.

FIG. 20 is a flowchart for describing a method for manufacturing the image pickup apparatus 1G. The flowchart is different from the flowchart of the method for manufacturing the image pickup apparatus 1C illustrated in FIG. 11 only in a wafer step S21A, and thus description of steps other than the step will be omitted.

<Step S21A1>
A plurality of light-receiving sections 12 and light-receiving sections 12, etc., provided in rows on peripheries of the respective light-receiving sections 12 are formed on a light-receiving surface 10SA of a semiconductor wafer 10WC.
<Step S21A2>
Grooves 11CX are formed in the light-receiving surface 10SA along cutting lines CL that are parallel with a direction of the rows of a plurality of bumps 14 from among cutting lines for a cutting step. A depth of the grooves 11CX only needs to be smaller than a thickness of the semiconductor wafer 10WC.
<Step S21A3>
An insulating material including resin is charged into the grooves 11CX.
<Step S22>
The semiconductor wafer is cut along the cutting lines CL.

In the method for manufacturing the image pickup apparatus 1G, the manufacture is easy because insulation portions 17 in a plurality of ultra-compact image pickup devices 10G are fabricated simultaneously in the wafer step.

Having described the preferred embodiments of the invention referring to the accompanying drawings, it should be understood that the present invention is not limited to those precise embodiments and various changes and modifications thereof could be made by one skilled in the art without departing from the sprit or scope of the invention as defined the appended claims.

What is claimed is:

1. An image pickup apparatus comprising:
   an image pickup device including a plurality of electrode pads provided in a row on an outer peripheral portion of a light-receiving surface on which a light-receiving section is formed, the plurality of electrode pads being connected to the light-receiving section; and
   a flexible wiring board including a plurality of inner leads each connected to any one electrode pad of the plurality of electrode pads,
   wherein each of the plurality of inner leads includes a distal end portion, a bent portion and a rear end portion, the bent portion includes a first bent portion having a recessed shape, relative to the light-receiving surface and a second bent portion having a protruding shape relative to the light-receiving surface, and the rear end portion is disposed in parallel with a side face of the image pickup device;
   the rear-end portion of the plurality of inner leads extending from an end face of the flexible wiring board, the end face of the flexible wiring board being smaller in width than a front face of the flexible wiring board;
   one or more insulating members having a protruding shape, the one or more insulating members being disposed on the light-receiving surface of the image pickup device between the light-receiving section and the plurality of electrode pads; and
   a bump is disposed on each of the plurality of electrode pads, the distal end portion of each inner lead being electrically connected to a corresponding bump;
   wherein the rear end portion is disposed in parallel with the side face of the image pickup device via the bent portion, the bent portion being in abutment with the one or more insulating members; and
   a first height of the one or more insulating members above the light receiving surface is greater than a second height of each corresponding bump above the light receiving surface such that a corresponding one of the first bent portions extends away from the light receiving surface relative to a corresponding one of the distal end portions.

2. The image pickup apparatus according to claim 1, wherein the one or more insulating members comprises an insulating member having a rod-like shape with which the plurality of inner leads are in abutment.

3. The image pickup apparatus according to claim 1, wherein the inner leads are sealed by a resin material.

4. The image pickup apparatus according to claim 1, wherein:
a length of the inner leads is no less than 200 μm and no more than 400 μm;
a thickness of the image pickup device is no less than 100 μm and no more than 300 μm; and
a length of the distal end portions of the inner leads is no less than 30 μm and no more than 100 μm.

5. The image pickup apparatus according to claim 1, wherein the image pickup device includes a guard ring including a conductive material on the light-receiving surface along an outer peripheral end portion.

6. The image pickup apparatus according to claim 5, wherein an inner lead having a ground potential from among the plurality of inner leads is connected to the guard ring.

7. The image pickup apparatus according to claim 1, wherein the one or more insulating members comprise a plurality of insulating members each corresponding to one of the plurality of electrode pads.

8. A method for manufacturing an image pickup apparatus, the method comprising:
a wafer step of fabricating a semiconductor wafer to provide, on a light-receiving surface:
a plurality of light-receiving sections;
a plurality of electrode pads provided in a row on a periphery of each light-receiving section, the plurality of electrode pads being connected to the light-receiving section;
a bump on each of the plurality of electrode pads; and
one or more insulating members having a protruding shape between each of the light-receiving sections and each of the plurality of electrode pads, a first height of the one or more insulating members above the light receiving surface being greater than a second height of each corresponding bump above the light receiving surface;
a cutting step of cutting the semiconductor wafer into individual image pickup devices each including the one or more insulating members and the plurality of electrode pads provided in a row on an outer peripheral portion of the light-receiving section;
a bonding step of connecting a distal end portion of each of a plurality of inner leads protruding from an end face of a flexible wiring board to a respective one of the plurality of bumps of the image pickup device;
a first bending step of plastically deforming a bent portion of each of the plurality of inner leads to extend away from the light receiving surface relative to a corresponding distal end portion of each of the plurality of inner leads so as to be inclined relative to the light-receiving surface, the distal end portion of each of the plurality of inner leads being connected to a respective one of the plurality of bumps; and
a second bending step of bending and plastically deforming the plurality of inner leads so that a rear end portion of each of the plurality of inner leads is parallel with a side face of the image pickup device, the rear-end portions of the plurality of inner leads extending from the end face of the flexible wiring board, the end face of the flexible wiring board being smaller in width than a front face of the flexible wiring board;
wherein:
in the first bending step, the bent portion of each of the inner leads is bent so as to be in abutment with the one or more insulating members so that a respective one of the rear end portions of the plurality of inner leads is parallel with the side face of the image pickup device.

9. The method for manufacturing an image pickup apparatus according to claim 8, wherein in the first bending step and the second bending step, the plurality of inner leads are bent simultaneously by moving a holding portion with a substrate portion, from which the plurality of inner leads of the flexible wiring board protrude, held by the holding portion.

10. The method for manufacturing an image pickup apparatus according to claim 8, wherein in the first bending step and the second bending step, the plurality of inner leads are bent simultaneously by moving a holding portion with a substrate portion, from which the plurality of inner leads of the flexible wiring board protrude, held by the holding portion.

11. The method for manufacturing an image pickup apparatus according to claim 8, wherein the one or more insulating members comprises an insulating member having a rod-like shape.

12. The method for manufacturing an image pickup apparatus according to claim 8, wherein:
in the wafer step, a groove is formed along a cutting line that is parallel with a direction of the row of the plurality of bumps from among cutting lines for the cutting step, and an insulating material is charged into the groove; and
in the cutting step, cutting is performed along the cutting lines.

13. The image pickup apparatus according to claim 1, wherein the flexible wiring board includes wirings electrically connected to at least one of the plurality of inner leads, the wirings being internal to the flexible wiring board.

14. The method for manufacturing an image pickup apparatus according to claim 8, wherein the flexible wiring board includes wirings electrically connected to at least one of the plurality of inner leads, the wirings being internal to the flexible wiring board.

15. The method for manufacturing an image pickup apparatus according to claim 8, wherein the one or more insulating members comprise a plurality of insulating members each corresponding to one of the plurality of electrode pads.

16. A method for manufacturing an image pickup apparatus, the method comprising:
a wafer step of fabricating a semiconductor wafer including, on a light-receiving surface, a plurality of light-receiving sections and a plurality of electrode pads provided in a row on a periphery of each light-receiving section, the plurality of electrode pads being connected to the each light-receiving section;
a cutting step of cutting the semiconductor wafer into individual image pickup devices each including the plurality of electrode pads provided in a row on an outer peripheral portion of the each light-receiving section;
a bonding step of connecting distal end portions of a plurality of inner leads protruding from an end face of a flexible wiring board to respective electrode pads of the plurality of electrode pads of the image pickup device;

a first bending step of plastically deforming the plurality of inner leads so as to be inclined relative to the light-receiving surface, with respective portions of the plurality of inner leads, the respective portions being connected respectively to the plurality of electrode pads, as respective starting points;

an insertion step of inserting a bending assisting member along a side face of the image pickup device and bringing a distal end of the bending assisting member into abutment with the plurality of inner leads; and subsequent to the insertion step, a second bending step of bending and plastically deforming the plurality of inner leads so that rear end portions of the plurality of inner leads are parallel with the side face of the image pickup device, the rear-end portions of the plurality of inner leads extending from the end face of the flexible wiring board, the end face of the flexible wiring board being smaller in width than a front face of the flexible wiring board;

wherein in the second bending step, the plurality of inner leads are bent with respective parts of the plurality of inner leads, the respective parts being in abutment with the bending assisting member, as respective apexes.

17. The method for manufacturing an image pickup apparatus according to claim 16, wherein in the insertion step, the bending assisting member is bonded to the side face of the image pickup device.

* * * * *

UNITED STATES PATENT AND TRADEMARK OFFICE
CERTIFICATE OF CORRECTION

PATENT NO. : 10,381,393 B2
APPLICATION NO. : 15/241741
DATED : August 13, 2019
INVENTOR(S) : Suyama et al.

It is certified that error appears in the above-identified patent and that said Letters Patent is hereby corrected as shown below:

In the Claims

Column 14, Claim 1, Line 43 should read:
recessed shape relative to the light-receiving surface Signed and Sealed this
Eleventh Day of February, 2020

Andrei Iancu
*Director of the United States Patent and Trademark Office*